United States Patent
Kitano et al.

(10) Patent No.: US 10,320,377 B2
(45) Date of Patent: Jun. 11, 2019

(54) INSTRUMENTATION DEVICE HAVING PULSE OUTPUT FUNCTION

(71) Applicant: OVAL CORPORATION, Tokyo (JP)

(72) Inventors: Tetsushi Kitano, Tokyo (JP); Noriaki Nakayama, Tokyo (JP); Yoshimine Tanabu, Tokyo (JP); Kenji Washio, Tokyo (JP)

(73) Assignee: OVAL CORPORATION, Tokyo (JP)

(*) Notice: Subject to any disclaimer, the term of this patent is extended or adjusted under 35 U.S.C. 154(b) by 0 days.

(21) Appl. No.: 15/760,356

(22) PCT Filed: Sep. 14, 2016

(86) PCT No.: PCT/JP2016/077920
§ 371 (c)(1),
(2) Date: Mar. 15, 2018

(87) PCT Pub. No.: WO2017/047823
PCT Pub. Date: Mar. 23, 2017

(65) Prior Publication Data
US 2018/0262187 A1 Sep. 13, 2018

(30) Foreign Application Priority Data
Sep. 16, 2015 (JP) .................. 2015-182454

(51) Int. Cl.
*H03K 17/08* (2006.01)
*H03K 17/082* (2006.01)
(Continued)

(52) U.S. Cl.
CPC .......... *H03K 17/0822* (2013.01); *G01F 1/00* (2013.01); *G01F 3/10* (2013.01); *G01F 15/06* (2013.01); *G01F 15/068* (2013.01); *H01C 7/02* (2013.01)

(58) Field of Classification Search
CPC ... H03K 17/08; H03K 17/082; H03K 17/0822
See application file for complete search history.

(56) References Cited

U.S. PATENT DOCUMENTS 6,011,416 A * 1/2000 Mizuno .............. H03K 17/0822
327/108
6,181,541 B1 1/2001 Souri et al.
(Continued)

FOREIGN PATENT DOCUMENTS

| JP | 54-6473 | 1/1979 |
|----|---------|--------|
| JP | 2007-47018 | 2/2007 |
| JP | 2007-52679 | 3/2007 |

OTHER PUBLICATIONS

International Search Report dated Oct. 18, 2016 in International (PCT) Application No. PCT/JP2016/077920.

*Primary Examiner* — Hai L Nguyen
(74) *Attorney, Agent, or Firm* — Wenderoth, Lind & Ponack, L.L.P.

(57) ABSTRACT

An instrumentation device having a pulse output function for preventing breakage of a switching element even if a wrong wire is connected. A calculation unit includes: a positive power supply terminal; a negative power supply terminal; a signal terminal; a control circuit; an NPN-type transistor; a feedback circuit; a PTC thermistor; and an N-channel type MOSFET. The NPN-type transistor has a collector terminal connected to the positive power supply terminal, an emitter terminal connected to the negative power supply terminal, and a base terminal connected to the control circuit. The PTC thermistor is a resettable protection element, and is connected in series to the signal terminal. The N-channel type MOSFET has a drain terminal connected to the signal terminal through the PTC thermistor, a source terminal connected to the negative power supply
(Continued)

terminal on a downstream side of the feedback circuit, and a gate terminal connected to the control circuit.

1 Claim, 9 Drawing Sheets

(51) Int. Cl.
*G01F 1/00* (2006.01)
*G01F 3/10* (2006.01)
*G01F 15/06* (2006.01)
*H01C 7/02* (2006.01)

(56) References Cited

U.S. PATENT DOCUMENTS 8,405,430 B2 * 3/2013 Martin ............... H03K 17/0822
 327/108
8,487,668 B2 * 7/2013 Abe ................. H03K 17/08128
 327/108

* cited by examiner

INSTRUMENTATION DEVICE HAVING PULSE OUTPUT FUNCTION

TECHNICAL FIELD

The present invention relates to an instrumentation device having a pulse output function. For example, there is given a field of flowmeters, such as a volumetric flowmeter, and a calculation unit provided in the flowmeter.

BACKGROUND ART

As the above-mentioned volumetric flowmeter, there has been known, for example, a volumetric flowmeter proposed by the applicant of the present application as described below as Patent Literature 1. Now, a configuration and structure of a related-art volumetric flowmeter are described with reference to the drawings.

In FIG. 7, a volumetric flowmeter 101 includes a main body 102 and a calculation unit 103 mounted on the main body 102. As illustrated in FIG. 8, the volumetric flowmeter 101 is a flowmeter (instrumentation device), which is mounted in a midway part of a pipe 104, and can meter a fluid to be measured flowing through an inside of the pipe 104 and perform calculation regarding a flow rate to display the calculation result in the calculation unit 103. The above-mentioned display is performed by a display unit 105 described later.

In FIG. 8, a strainer 107 is arranged between the pipe 104 on an upstream side and an upstream-side flange 106 of the main body 102. There is illustrated a bypass pipe 108 in FIG. 8. Further, there are illustrated valves 109. The bypass pipe 108 is arranged as a portion to be used for an overhaul of the volumetric flowmeter 101.

In FIG. 7 and FIG. 9, the main body 102 includes: a front lid portion 113 on which a mounting base 112 of the calculation unit 103 is mounted; a metering chamber forming portion 115 including a metering chamber 114; two rotors 117 and 118, which are accommodated in the metering chamber 114, and are rotated by rotor shafts 116; and the upstream-side flange 106 and a downstream-side flange 110 contiguous to the metering chamber forming portion 115. The front lid portion 113 is formed into a member for covering the metering chamber 114 under a state in which the rotors 117 and 118 are accommodated in a rotatable manner in the metering chamber 114. The front lid portion 113 is fixed to the metering chamber forming portion 115 with screws 119.

The rotor 117 includes two magnets 122, that is, an S-pole magnet and an N-pole magnet. The two magnets 122 are arranged at a distance as illustrated in the figure. The two magnets 122 are detected by a detection unit accommodated in a recessed portion 123 of the front lid portion 113, that is, a flow rate detection unit (not shown) of the calculation unit 103.

There is illustrated a pulse transmitter 127. The pulse transmitter 127 is connected to, for example, an F/I converter (not shown) and an integrator (not shown) through an output cable 128. The F/I converter and the integrator are provided in, for example, a remote management chamber.

A display main body unit 124 includes a unit case 129, a substrate having the display unit 105 mounted thereon, and a battery (not shown) for supplying electric power to the substrate. The substrate is accommodated in the unit case 129, and is fixed thereto with screws. The battery is also accommodated in the unit case 129. A cover 125 includes a transparent viewing portion 130 facing the display unit 105, and switches 131 and 132 for operation.

CITATION LIST

Patent Literature

[PTL 1] JP 2007-47018 A

SUMMARY OF INVENTION

Technical Problem

The above-mentioned related-art flowmeter (instrumentation device) has a problem in that, when wrong wire connection occurs at a time of connection of a power supply from outside, and as a result, for example, a large current flows, a switching element (transistor) (not shown) arranged in the pulse transmitter 127 is broken. In view of the foregoing, provision of a fuse has been considered. However, in this case, it is required to replace the fuse, with the result that there is a problem of an unsatisfactory maintenance property.

The present invention has been made in view of the above-mentioned circumstances, and it is an object of the present invention to provide an instrumentation device having a pulse output function, which is capable of preventing breakdown of a switching element from occurring even when wrong wire connection occurs.

Solution to Problem

In order to solve the above-mentioned problem, according to one embodiment of the present invention, as described in claim 1, there is provided an instrumentation device having a pulse output function, the instrumentation device including: a positive power supply terminal; a negative power supply terminal; a signal terminal; a control circuit connected to the positive power supply terminal through a power supply circuit; an NPN-type transistor having a collector terminal connected to the positive power supply terminal, an emitter terminal connected to the negative power supply terminal, and a base terminal connected to the control circuit; a feedback circuit connected between the negative power supply terminal and the emitter terminal and connected to the control circuit; a PTC thermistor connected in series to the signal terminal; and an N-channel type MOSFET having a drain terminal connected to the signal terminal through the PTC thermistor, a source terminal connected to the negative power supply terminal on a downstream side of the feedback circuit, and a gate terminal connected to the control circuit.

Advantageous Effects of Invention

According to the present invention as described in claim 1, for example, in a case of wrong wire connection in which an external power supply terminal (+) is connected to the signal terminal, and an external power supply terminal (−) is connected to the negative power supply terminal, and further even in a case in which a large current flows, there is an effect that a switching element can be protected by a resettable protection element, that is, a PTC thermistor. Further, according to the present invention, for example, even in a case of wrong wire connection (reverse wire connection) in which the external power supply terminal (+) is connected to the negative power supply terminal, and the external power supply terminal (−) is connected to the signal terminal, there is an effect that the switching element can be protected in the same manner as in the foregoing, because the N-channel type MOSFET is used as the switching element, and the resettable protection element (PTC thermistor) is provided. In addition, according to the present invention, there is also an effect that an error of a signal can be suppressed, which is described later in Example section. Thus, according to the present invention, there is an effect that breakage of the switching element can be prevented even in a case of wrong wire connection, and hence a more satisfactory instrumentation device can be provided.

DESCRIPTION OF EMBODIMENTS

A calculation unit of a flowmeter includes a positive power supply terminal, a negative power supply terminal, and a signal terminal, a control circuit, an NPN-type transistor, a feedback circuit, a PTC thermistor, and an N-channel type MOSFET. The control circuit is connected to the positive power supply terminal through a power supply circuit. The NPN-type transistor has a collector terminal connected to the positive power supply terminal, an emitter terminal connected to the negative power supply terminal, and a base terminal connected to the control circuit. The feedback circuit is arranged between the negative power supply terminal and the emitter terminal, and is connected to the control circuit. The PTC thermistor is a resettable protection element, and is connected in series to the signal terminal. The N-channel type MOSFET has a drain terminal connected to the signal terminal through the PTC thermistor, a source terminal connected to the negative power supply terminal on a downstream side of the feedback circuit, and a gate terminal connected to the control circuit.

EXAMPLE

Figure 1:
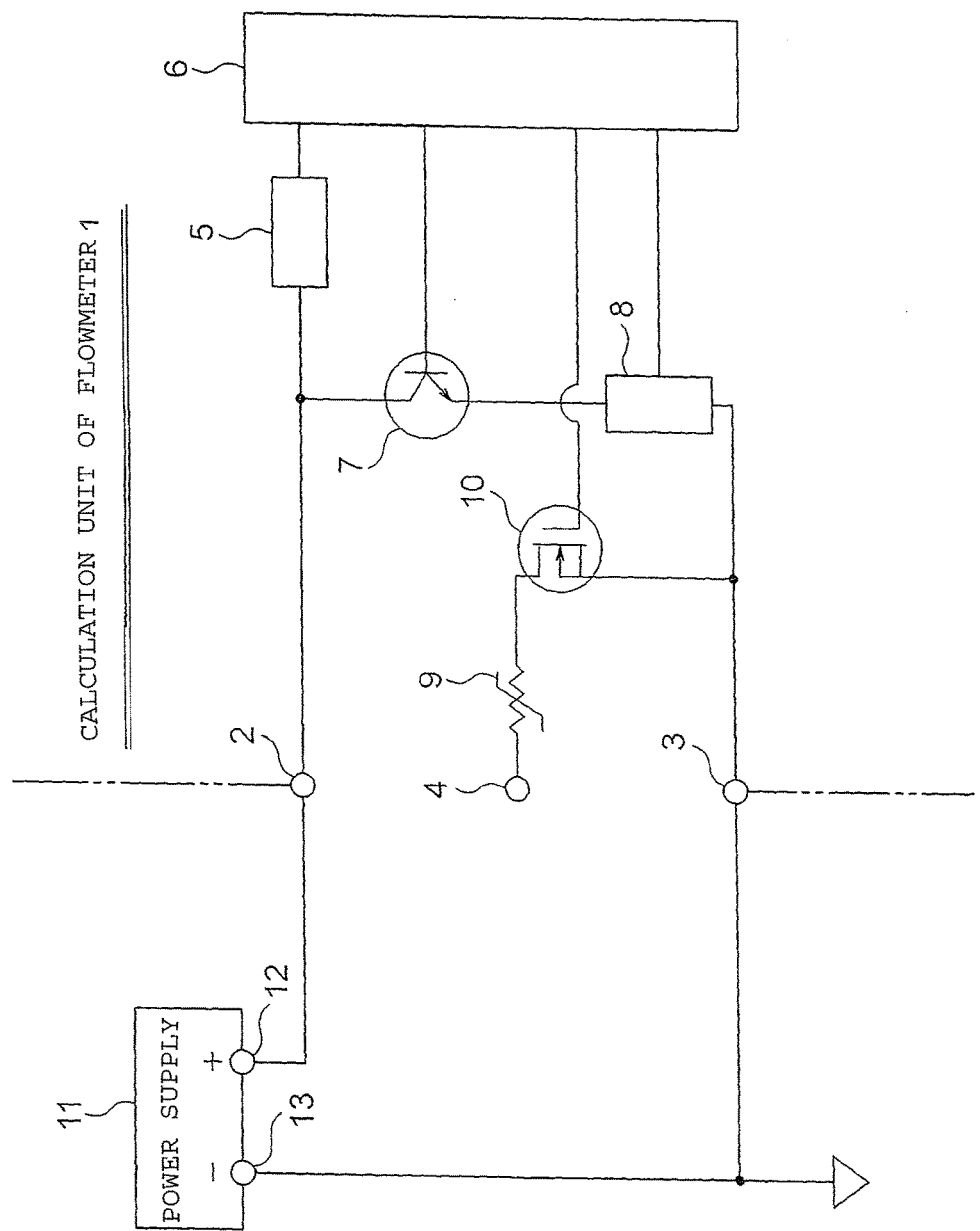
FIG. 1 is a block diagram for illustrating a circuit configuration of a calculation unit of a flowmeter serving as an instrumentation device having a pulse output function according to one embodiment of the present invention.
Figure 2:
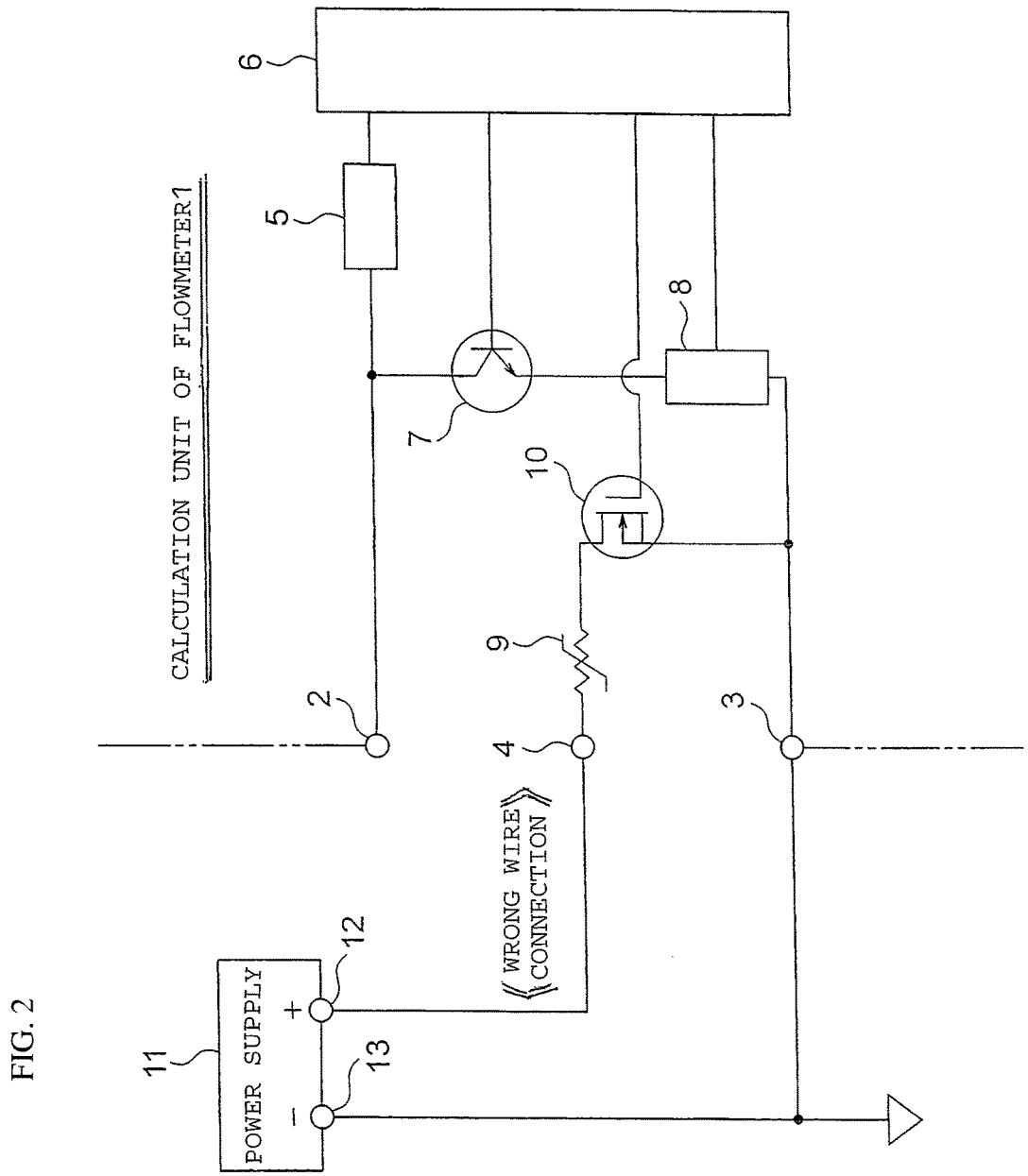
FIG. 2 is a block diagram for illustrating a state in which wrong wire connection occurs in FIG. 1.
Figure 3:
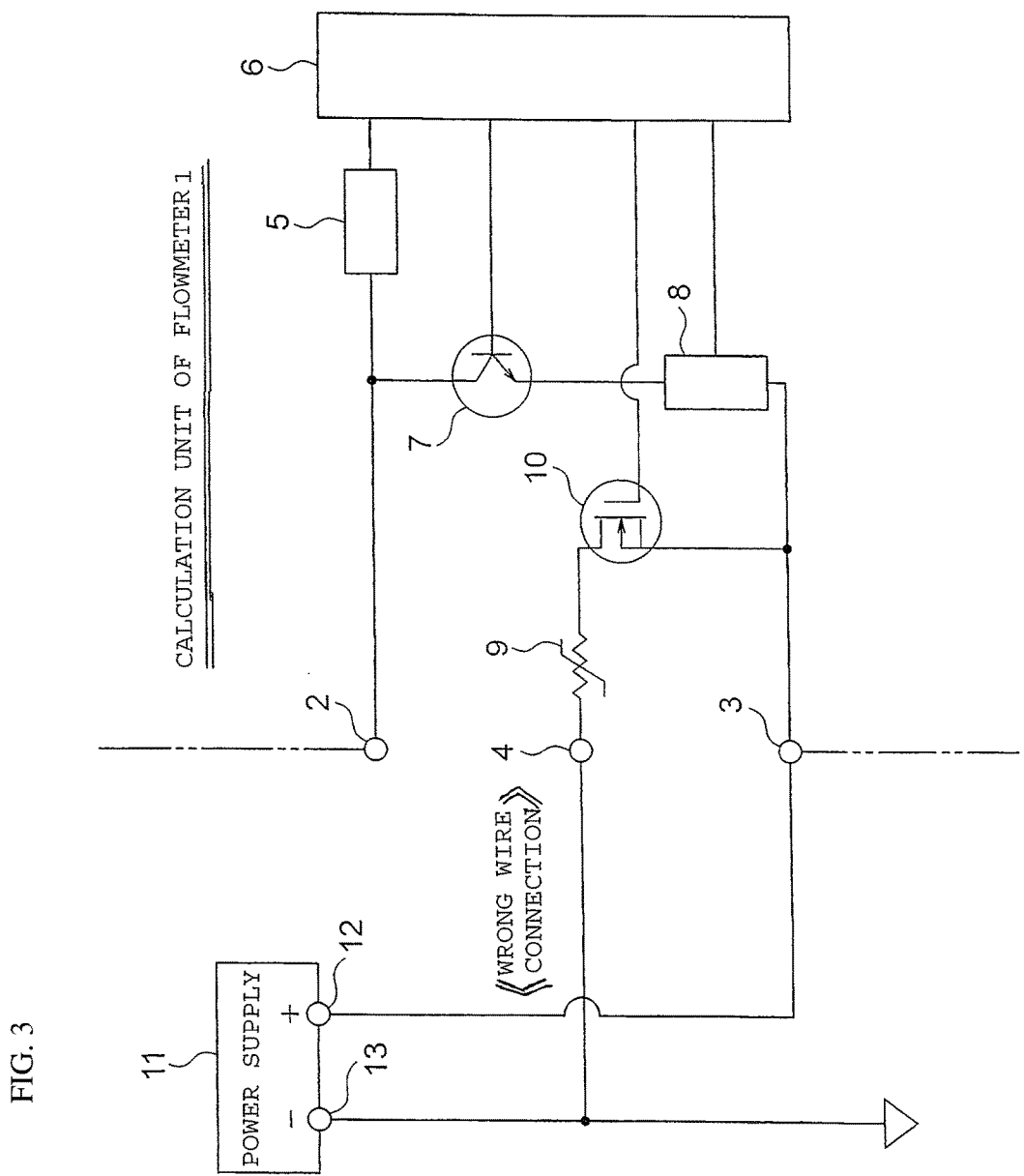
FIG. 3 is a block diagram for illustrating a state in which wrong wire connection occurs in FIG. 1.

Now, description is given of Example with reference to the drawings. FIG. 1 is a block diagram for illustrating a circuit configuration of a calculation unit of a flowmeter serving as an instrumentation device having a pulse output function according to one embodiment of the present invention. Further, FIG. 2 and FIG. 3 are each a block diagram for illustrating a state in which wrong wire connection occurs in FIG. 1.

Figure 7:
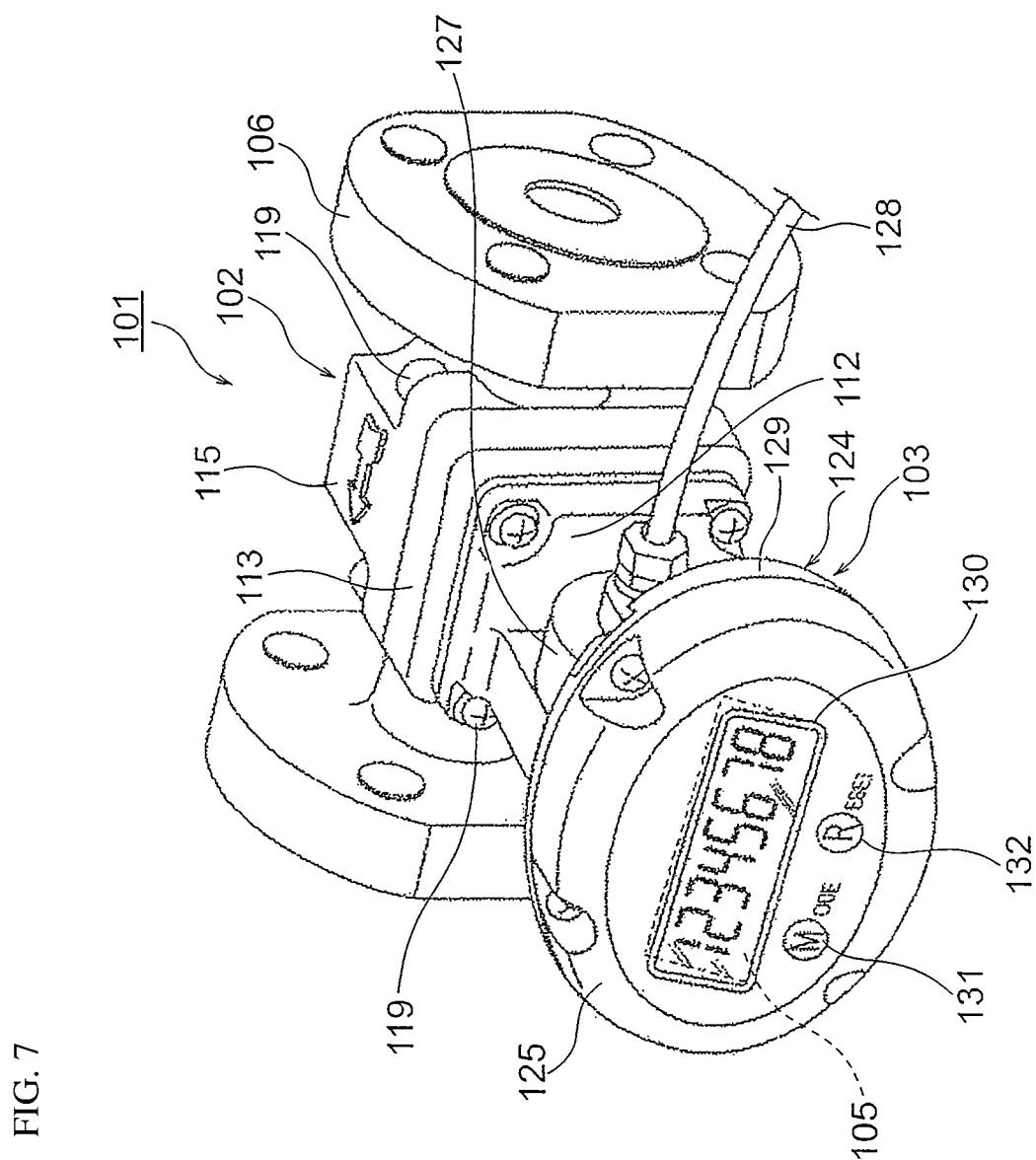
FIG. 7 is a perspective view of a volumetric flowmeter in the related art.
Figure 8:
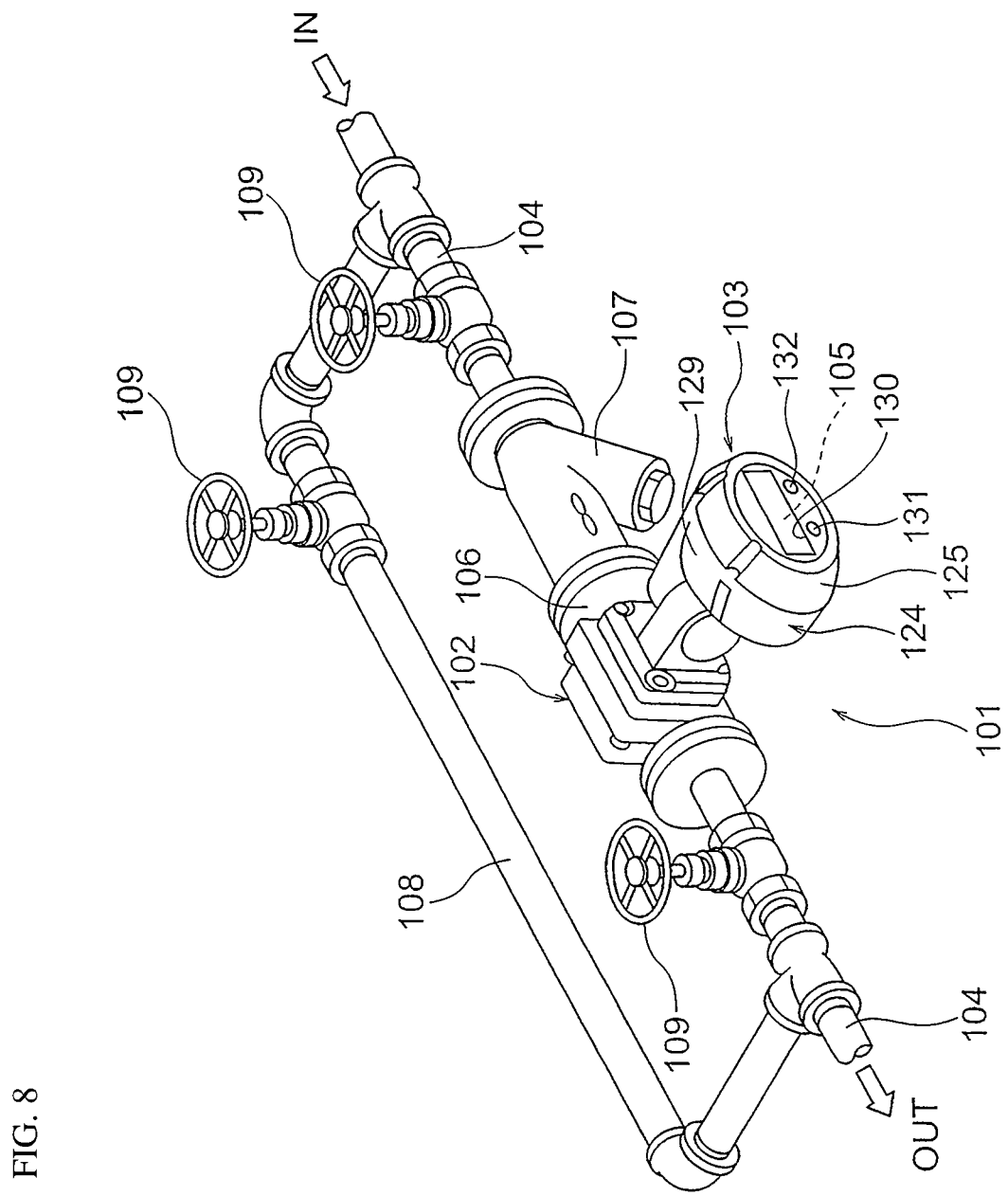
FIG. 8 is a perspective view of a state in which the volumetric flowmeter of FIG. 7 is mounted in a midway part of a pipe.
Figure 9:
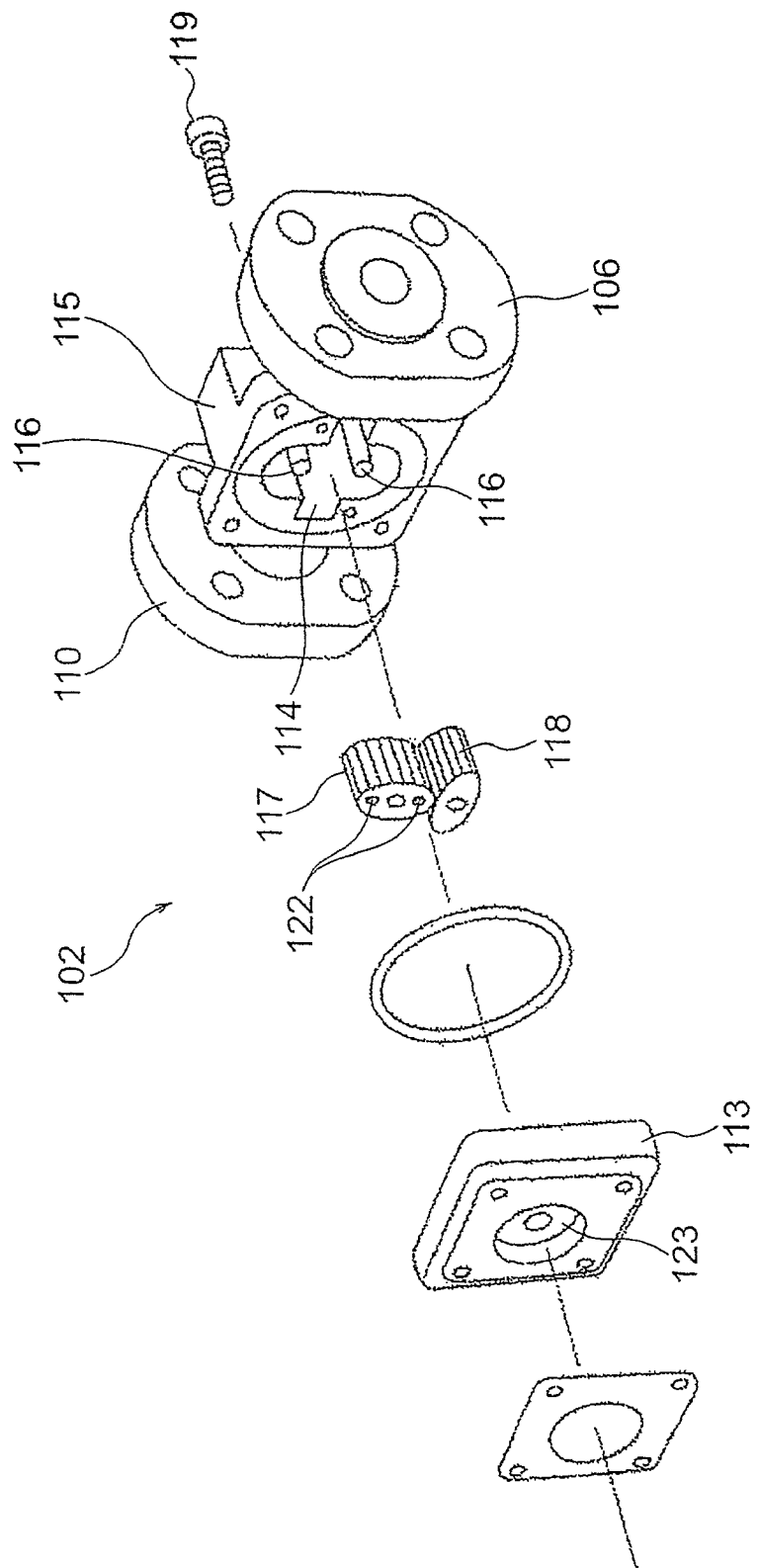
FIG. 9 is an exploded perspective view of a main body in the volumetric flowmeter of FIG. 7.

In FIG. 1, a calculation unit 1 included in, for example, a volumetric flowmeter includes a positive power supply terminal 2, a negative power supply terminal 3, and a signal terminal 4. The number of signal terminal 4 in Example is one, but the number is not particularly limited thereto. Further, a basic configuration of the above-mentioned volumetric flowmeter is the same as that of the related-art volumetric flowmeter 101 described with reference to FIG. 7 to FIG. 9, and hence description thereof is omitted here.

A power supply circuit 5 is connected to the positive power supply terminal 2. A control circuit 6 is connected to the power supply circuit 5. The control circuit 6 is provided so as to perform various controls in the calculation unit 1 (as examples of the controls, there are given on/off control of an NPN-type transistor 7 and an N-channel type MOSFET 10 described later, and control of a feedback circuit 8. Further, the NPN-type transistor 7 is also connected to the positive power supply terminal 2.

The NPN-type transistor 7 is a known NPN-type transistor. A collector terminal (reference symbol is not shown) of the NPN-type transistor 7 is connected to the positive power supply terminal 2. Further, an emitter terminal (reference symbol is not shown) thereof is connected to the negative power supply terminal 3 through the feedback circuit 8 for current control. Further, abase terminal (reference symbol is not shown) thereof is connected to the control circuit 6.

A PTC thermistor 9 is connected in series to the signal terminal 4. The PTC thermistor 9 is a polymer-based device, and is also a device having a resistance value that changes abruptly when a temperature inside an element becomes higher than a certain temperature. More specifically, the PTC thermistor 9 is a device in which, when heat is generated due to an excess current and the element temperature rises to increase the resistance value, a circuit current can be limited minutely. The resistance value of the PTC thermistor 9 returns to an original value when the element temperature lowers, and hence the PTC thermistor 9 has an advantage in that the PTC thermistor 9 is not required to be replaced unlike a fuse.

The PTC thermistor 9 exhibits an important function of the present invention when being used in combination with the N-channel type MOSFET 10 described later.

The N-channel type MOSFET 10 is an N-channel type Metal-Oxide-Semiconductor-Field Efect (MOFET). A drain terminal (reference symbol is not shown) of the N-channel type MOSFET 10 is connected to the signal terminal 4 through the PTC thermistor 9. Further, a source terminal (reference symbol is not shown) thereof is connected to the negative power supply terminal 3 on a downstream side of the feedback circuit 8. Further, a gate terminal (reference symbol is not shown) thereof is connected to the control circuit 6. The N-channel type MOSFET 10 is an element capable of applying a voltage between the gate terminal and the source terminal to control a current from the drain terminal with the magnitude of the voltage. Further, the N-channel type MOSFET 10 is an element in which an input resistance to the gate terminal is significantly high, and a current hardly flows.

As is understood from FIG. 1, in the calculation unit 1, two circuits, that is, an open collector output circuit and an open drain output circuit are formed. The calculation unit 1 is configured to control the level of an instant signal value, which is currently being measured, with a current amount drawn in from an external power supply 11. In Example, the measured instant signal is transmitted outside by changing the draw-in amount of a consumption current within a range of from 4 mA to 20 mA, and the signal is used in, for example, an F/I converter (not shown) and an integrator (not shown).

Consideration is given of the case of wrong wire connection in which an external power supply terminal (+) 12 is connected to the signal terminal 4, and an external power supply terminal (−) 13 is connected to the negative power supply terminal 3, for example, as illustrated in FIG. 2. When the N-channel type MOSFET 10 is in an ON state, the N-channel type MOSFET 10 is protected from an excess current due to the presence of the PTC thermistor 9. Meanwhile, when the N-channel type MOSFET is in an OFF state, a large current does not flow, with the result that the N-channel type MOSFET 10 is not broken. Thus, even when the above-mentioned wrong wire connection occurs, there is an effect that the N-channel type MOSFET 10 can be protected.

In FIG. 3, there is illustrated the case of wrong wire connection (wire connection reverse to the example of FIG. 2) in which the external power supply terminal (+) 12 is connected to the negative power supply terminal 3, and the external power supply terminal (−) 13 is connected to the signal terminal 4. In this case, when the N-channel type MOSFET 10 is in an ON state, a current flows, but the N-channel type MOSFET 10 is protected from an excess current due to the presence of the PTC thermistor 9. Meanwhile, when the N-channel type MOSFET 10 is in an OFF state, a large current flows to the PTC thermistor 9 through a body diode (not shown, a function originally owned by the N-channel type MOSFET 10) of the N-channel type MOSFET 10, with the result that the N-channel type MOSFET 10 is not broken. Thus, even when the above-mentioned wrong wire connection occurs, there is an effect that the N-channel type MOSFET 10 can be protected.

Figure 4:
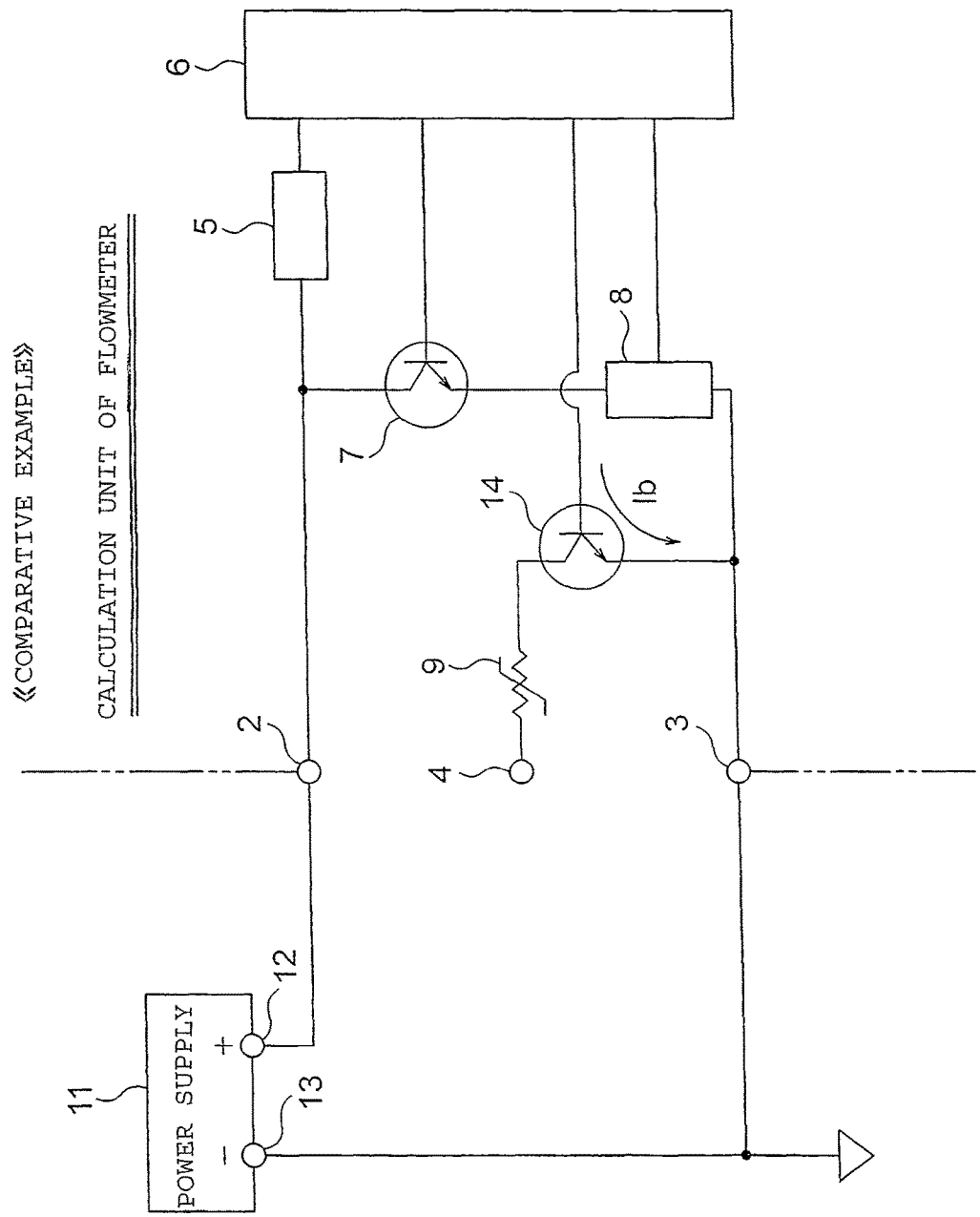
FIG. 4 is a block diagram for illustrating a circuit configuration of a calculation unit of a flowmeter according to Comparative Example.
Figure 5:
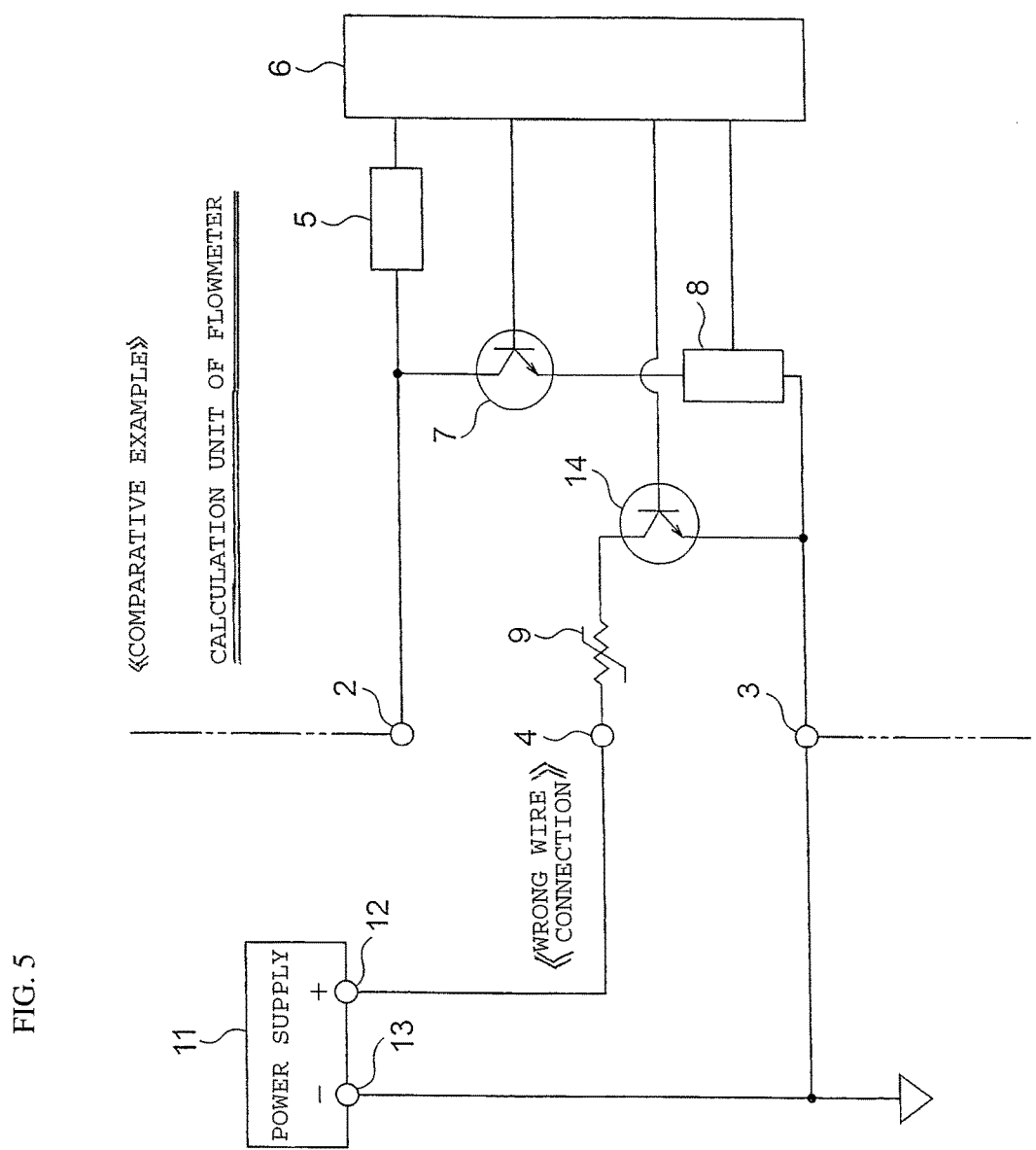
FIG. 5 is a block diagram for illustrating a state in which wrong wire connection occurs in FIG. 4.
Figure 6:
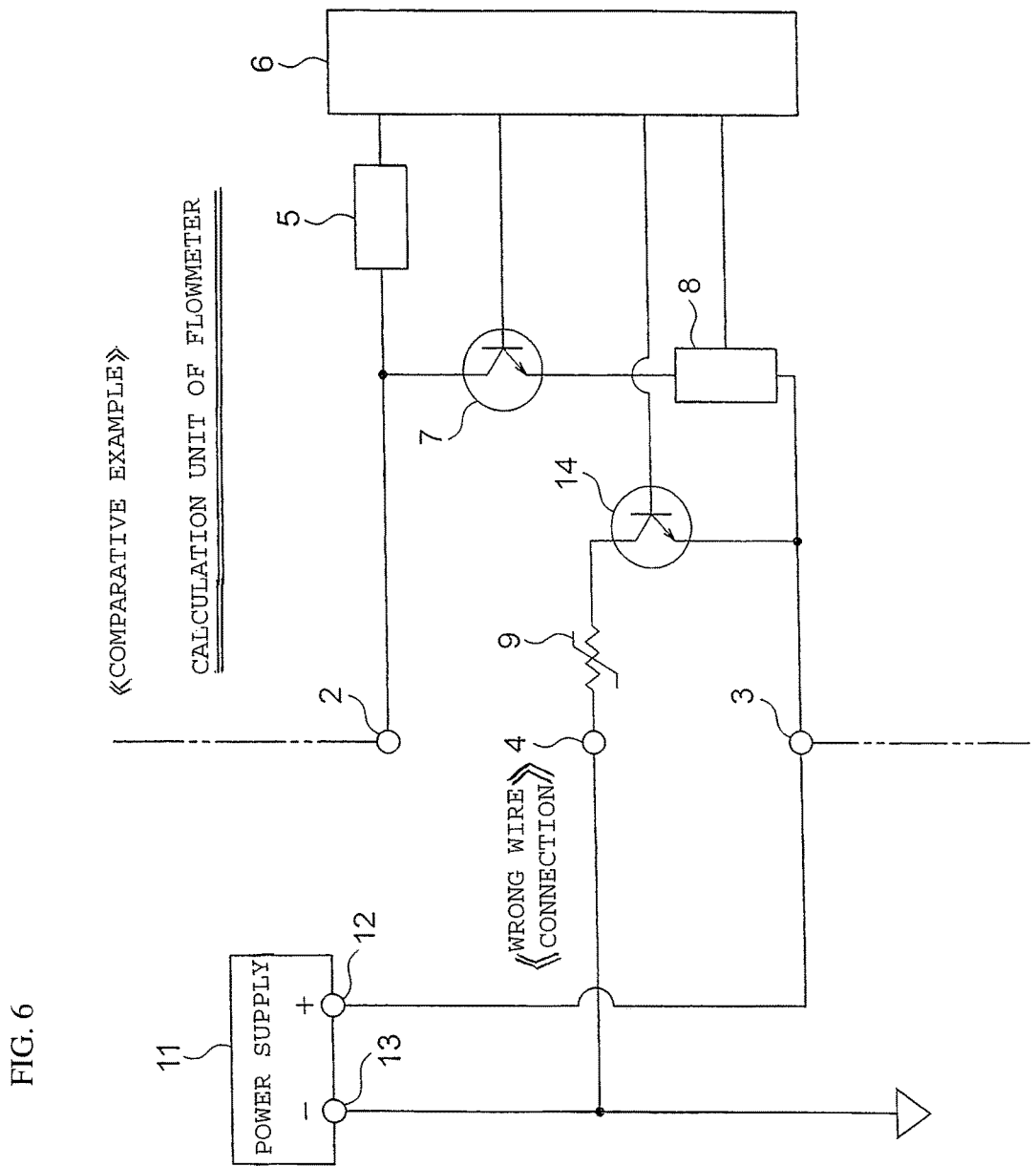
FIG. 6 is a block diagram for illustrating a state in which wrong wire connection occurs in FIG. 4.

Now, description is given of Comparative Example with reference to FIG. 4 to FIG. 6. FIG. 4 is a block diagram for illustrating a circuit configuration of a calculation unit of a flowmeter according to Comparative Example. Further, FIG. 5 and FIG. 6 are each a block diagram for illustrating a state in which wrong wire connection occurs in FIG. 4. Comparative Example adopts an NPN-type transistor 14 in place of the N-channel type MOSFET 10 of FIG. 1 to FIG. 3.

In FIG. 4, according to Comparative Example, a collector terminal (reference symbol is not shown) of the transistor 14 is connected to the signal terminal 4 through the PTC thermistor 9. Further, an emitter terminal (reference symbol is not shown) thereof is connected to the negative power supply terminal 3 on the downstream side of the feedback circuit 8. Further, abase terminal (reference symbol is not shown) thereof is connected to the control circuit 6. In Comparative Example, as illustrated in a portion of the transistor 14, there is a risk in that a base current Ib may leak outside of the feedback circuit 8 for current control. When leakage of the base current Ib occurs, an error of a current signal may be caused (this error does not occur in the present invention illustrated in FIG. 1 to FIG. 3).

Consideration is given of the case of wrong wire connection in which the external power supply terminal (+) 12 is connected to the signal terminal 4, and the external power supply terminal (−) 13 is connected to the negative power supply terminal 3, for example, as illustrated in FIG. 5. When the transistor 14 is in an ON state, the transistor 14 is protected from an excess current due to the presence of the PTC thermistor 9. Meanwhile, when the transistor 14 is in an OFF state, a large current does not flow, with the result that the transistor 14 is not broken. Thus, even when the above-mentioned wrong wire connection occurs, there is an effect that the transistor 14 can be protected.

However, in the case of wrong wire connection (wire connection reverse to the example of FIG. 5) in which the external power supply terminal (+) 12 is connected to the negative power supply terminal 3, and the external power supply terminal (−) 13 is connected to the signal terminal 4 as illustrated in FIG. 6, when the transistor 14 is in an ON state, a large current flows backward from the emitter terminal to the collector terminal, and hence there is a risk in that the transistor 14 maybe significantly degraded. Meanwhile, when the transistor 14 is in an OFF state, a breakdown voltage between the emitter terminal and the collector terminal is small, and hence a large current flows even in the absence of abase current, with the result that the transistor 14 is broken. It is conceivable to add a diode in order to give the function of the N-channel type MOSFET 10 (see FIG. 1 to FIG. 3). However, it is not effective to add the diode because a leakage current from the diode leads to an error of a current signal.

As described above with reference to FIG. 1 to FIG. 6, when two circuits, that is, the open collector output circuit and the open drain output circuit are not electrically insulated from each other (see FIG. 1 to FIG. 3), it is effective to use the PTC thermistor 9 and the N-channel type MOSFET 10 in combination. Further, as is understood from the comparison with Comparative Example (see FIG. 4 to FIG. 6), as a matter of course, the present invention (see FIG. 1 to FIG. 3) is more effective.

The configuration and effects of the present invention are summarized as follows. The calculation unit 1 in the volumetric flowmeter includes the positive power supply terminal 2, the negative power supply terminal 3, the signal terminal 4, the control circuit 6, the NPN-type transistor 7, the feedback circuit 8, the PTC thermistor 9, and the N-channel type MOSFET 10. The control circuit 6 is connected to the positive power supply terminal 2 through the power supply circuit 5. The NPN-type transistor 7 has the collector terminal connected to the positive power supply terminal 2, the emitter terminal connected to the negative power supply terminal 3, and the base terminal connected to the control circuit 6. The feedback circuit 8 is arranged between the negative power supply terminal 3 and the emitter terminal, and is connected to the control circuit 6. The PTC thermistor 9 serves as the resettable protection element, and is connected in series to the signal terminal 4. The N-channel type MOSFET 10 has the drain terminal connected to the signal terminal 4 through the PTC thermistor 9, the source terminal connected to the negative power supply terminal 3 on the downstream side of the feedback circuit 8, and the gate terminal connected to the control circuit 6.

Thus, according to the present invention, there is an effect that breakage of the switching element can be prevented from occurring even in a case of wrong wire connection, and hence the more satisfactory calculation unit 1 can be provided.

In Example, the volumetric flowmeter (flowmeter) is given as one embodiment of the instrumentation device having a pulse output function. Therefore, when the present invention is limited to a flowmeter, the scope of the claim is defined as follows.

"A flowmeter, comprising:
a positive power supply terminal;
a negative power supply terminal;
a signal terminal;

a control circuit connected to the positive power supply terminal through a power supply circuit;

an NPN-type transistor having a collector terminal connected to the positive power supply terminal, an emitter terminal connected to the negative power supply terminal, and a base terminal connected to the control circuit;

a feedback circuit connected between the negative power supply terminal and the emitter terminal and connected to the control circuit;

a PTC thermistor connected in series to the signal terminal; and an N-channel type MOSFET having a drain terminal connected to the signal terminal through the PTC thermistor, a source terminal connected to the negative power supply terminal on a downstream side of the feedback circuit, and a gate terminal connected to the control circuit."

As a matter of course, the present invention can be variously modified within a range and without departing from the spirit of the present invention.

REFERENCE SIGNS LIST

1 . . . calculation unit
2 . . . positive power supply terminal
3 . . . negative power supply terminal
4 . . . signal terminal
5 . . . power supply circuit
6 . . . control circuit
7 . . . NPN-type transistor
8 . . . feedback circuit
9 . . . PTC thermistor
10 . . . N-channel type MOSFET
11 . . . external power supply
12 . . . external power supply terminal (+)
13 . . . external power supply terminal (−)
14 . . . transistor

The invention claimed is:

1. An instrumentation device having a pulse output function, the instrumentation device comprising:
   a positive power supply terminal;
   a negative power supply terminal;
   a signal terminal;
   a control circuit connected to the positive power supply terminal through a power supply circuit;
   an NPN-type transistor having a collector terminal connected to the positive power supply terminal, an emitter terminal connected to the negative power supply terminal, and a base terminal connected to the control circuit;
   a feedback circuit connected between the negative power supply terminal and the emitter terminal and connected to the control circuit;
   a PTC thermistor connected in series to the signal terminal; and
   an N-channel type MOSFET having a drain terminal connected to the signal terminal through the PTC thermistor, a source terminal connected to the negative power supply terminal on a downstream side of the feedback circuit, and a gate terminal connected to the control circuit.

* * * * *